United States Patent [19]

Petterson

[11] Patent Number: 4,725,816
[45] Date of Patent: Feb. 16, 1988

[54] MATRIX KEYBOARD ENCODER CIRCUIT

[75] Inventor: Michael A. Petterson, Marysville, Wash.

[73] Assignee: John Fluke Mfg. Co., Inc., Everett, Wash.

[21] Appl. No.: 680,187

[22] Filed: Dec. 10, 1984

[51] Int. Cl.$^4$ .............................................. H04L 1/00
[52] U.S. Cl. ............................ 340/365 S; 340/365 R
[58] Field of Search ............ 340/365 S, 365 R, 365 E, 340/825.77, 825.78; 178/18, 19; 84/1.04

[56] References Cited

U.S. PATENT DOCUMENTS

| | | |
|---|---|---|
| 2,940,669 | 6/1960 | Hobbs . |
| 3,088,103 | 4/1963 | Gryk .............................. 340/365 S |
| 3,456,077 | 7/1969 | Jones, Jr. . |
| 3,576,569 | 4/1971 | Watson ........................... 340/365 S |
| 4,015,254 | 3/1977 | Strandt ........................... 340/365 S |
| 4,293,849 | 10/1981 | Lacy . |
| 4,333,089 | 6/1982 | Leininger . |
| 4,374,384 | 2/1983 | Moates . |
| 4,408,184 | 10/1983 | Ishii . |
| 4,412,209 | 10/1983 | Frame et al. ................... 340/365 C |

FOREIGN PATENT DOCUMENTS 0066018  5/1980  Japan .

OTHER PUBLICATIONS

"Keyboard-to μP Interface Minimizes External Logic", by Roy Blacksher, END, Jan. 5, 1978, vol. 23, No. 1, pp. 32-34.
"4 by 4 Matrix Chip Encodes Larger Arrays", by James H. Nixon, Electronics (Apr. 24, 1980), vol. 53, No. 10, p. 133.
"Static Hexadecimal Keyboards", by Q. A. Rice, Design Focus, Electronics, vol. 12, No. 22, p. 51.
"Keyboard for 64-Key ASCII Code Features Very Low Power Consp.", by Hauser, Electronic Design, 1, Jan. 4, 1977, pp. 132-134.

Primary Examiner—John W. Caldwell, Sr.
Assistant Examiner—Tyrone Queen
Attorney, Agent, or Firm—John P. Dellett

[57] ABSTRACT

A keyboard encoding circuit includes a first and a second set of resistors and a switching matrix divided into a plurality of switch banks, one switch bank corresponding to each resistor in the first set. Each switch bank comprises a plurality of switches with each such switch in a bank corresponding to a resistor of the second set. Each resistor in the first set has one terminal coupled in common to a supply lead of a source of DC current and a second terminal coupled to a first side of each switch in the corresponding bank of switches. Each resistor in the second resistor set has one terminal coupled to a second side of corresponding switches in one or more switch banks and a second terminal coupled to a return lead of the DC current source. The resistors in the first and second resistor sets are sized such that the actuation of any one switch produces a unique DC output voltage between the supply and return leads of the current source and such that simultaneous activation of any two or more switches produces an output voltage which is distinguishable from any output voltage produced by activation of any one switch. A digital-to-analog converter is coupled to convert the unique DC output voltage into a digitally encoded signal.

13 Claims, 1 Drawing Figure

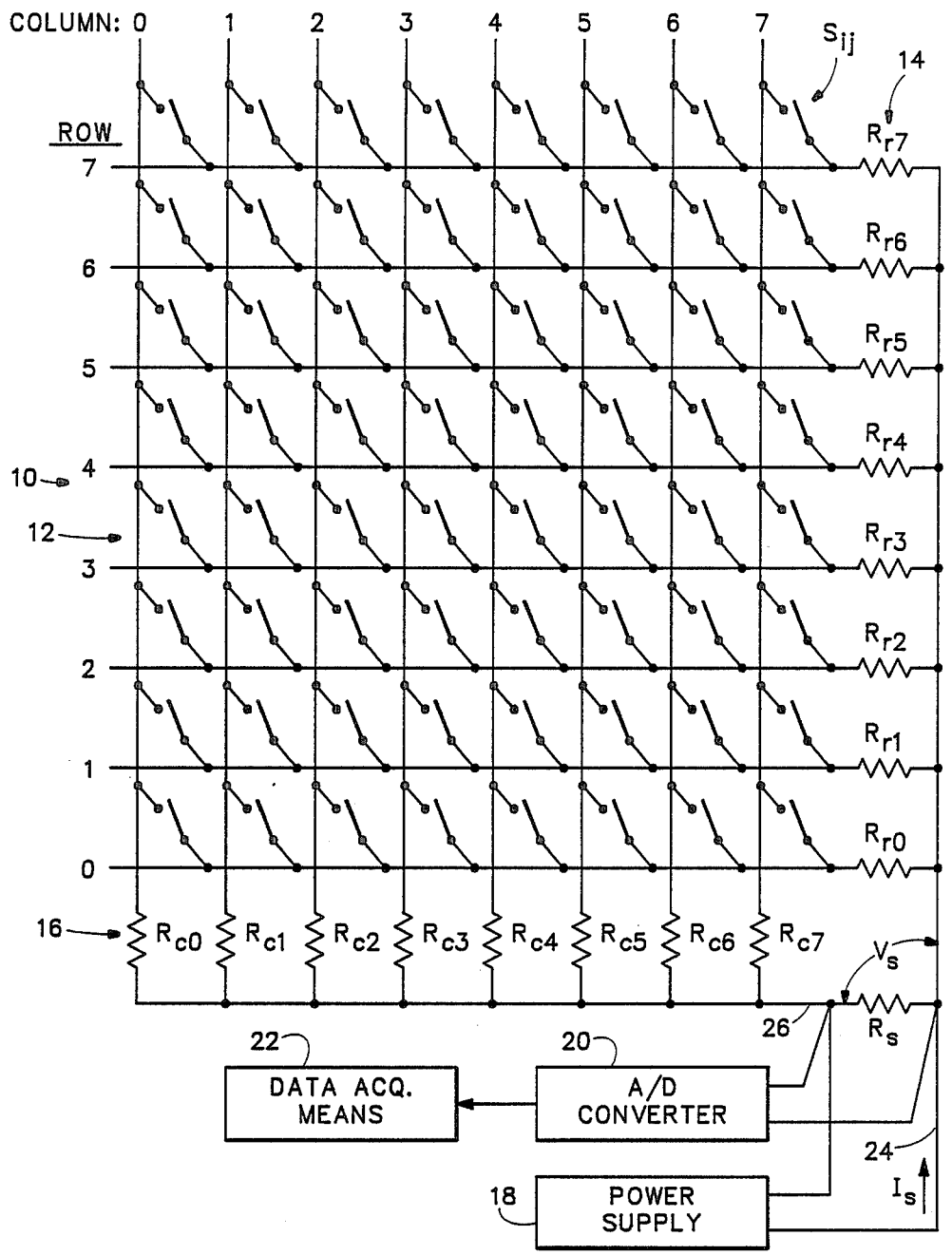

MATRIX KEYBOARD ENCODER CIRCUIT

BACKGROUND OF THE INVENTION

The present invention relates to keyboard encoder circuitry in general and particularly to keyboard encoding circuits for developing different predetermined analog voltage levels for each keyboard switch closure and utilizing an analog-to-digital converter for obtaining a digital output code for each voltage level.

Keyboard encoder circuits typically transmit a binary digital code to a data acquisition device such as a computer in response to closure of a key actuated switch, the code transmitted being unique for each key. Parallel encoding circuits typically require one data wire connection between the keyboard and the computer for each bit in the binary code. Serial type signal encoders typically reduce the number of data wires required to two by sending the code sequentially.

Often the encoder circuits, whether of the parallel or serial type, produce radio frequency noise which can be detrimental in some environments. This radio frequency noise can be avoided if the keyboard output signal comprises a low level analog voltage signal rather than a conventional digital signal. In U.S. Pat. No. 4,015,254 (Strandt) a keyboard encoding circuit is disclosed comprising a plurality of keyboard switches each having one side connected with a multi-resistor voltage divider network and a second side connected in common. With a DC voltage applied to the network, a unique keyboard output voltage is produced on the common switch connection for each switch closure. The common connection is coupled to a remote analog-to-digital converter which converts the unique voltage to a unique digital code for use by a computer.

One drawback to the encoding circuit described by Strandt lies in the inability of the circuit to determine when two or more keys have been simultaneously actuated. When two keys are actuated, the voltage associated with one of the keys is transmitted to the A/D converter. It would be beneficial in many applications if the simultaneous activation of two or more keys would produce an output voltage that is different than the output voltage produced by activating any one key.

Another drawback of the Strandt encoding circuit lies in the number of resistors required. Each additional key switch requires an additional resistor in the voltage divider network increasing the cost and size of the encoder. It would be of further benefit if the number of resistors required could be reduced particularly with respect to keyboards incorporating a large number of keys.

SUMMARY OF THE INVENTION

A keyboard encoding circuit according to the present invention comprises a matrix of switches interconnecting sets of input and output resistors. The switches may be considered as divided into banks (herein illustrated as rows), one switch bank corresponding to each resistor in a first set. Each switch bank has individual switches connected to resistors of the second set. Each resistor in the first set has one end lead coupled in common at a first output terminal to a source of constant DC current and a second end lead coupled to a first side of each switch in the corresponding bank of switches. Each resistor in the second resistor set has one end lead coupled to a second side of corresponding switches (making up a column as illustrated) in plural switch banks, and a second end lead coupled to a common second output terminal.

The resistors in the first and second resistor sets are sized such that the actuation of any one switch produces a unique DC output voltage between the first and second output terminals and such that simultaneous activation of any two or more switches produces an output voltage which is distinguishable from any output voltage produced by activation of any one switch. In a preferred embodiment of the present invention all resistors in the first set have different resistances, the highest resistance being on the order of twice the lowest, with intermediate resistances being equally spaced. The resistances of the second set are also different from one another, being equally spaced, the lowest being larger than a given resistance in the first set by an amount equal to the second set spacing, and the highest being equal to a next to the given resistance in the first set. This arrangement insures that a voltage produced at the output terminal by simultaneous activation of any two or more switches is greater than the voltage produced by activation of any one switch, and that the signal voltage levels so produced are evenly spaced.

The output terminals are coupled to a remote A/D converter for transforming the keyboard output voltages into digital codes for use by a computer or other data acquisition device. Even spacing of the output voltage signals permits use of A/D converters having minimally low resolution.

It is accordingly an object of the present invention to provide an improved keyboard encoding circuit for providing a DC output voltage signal upon operation of any key in the keyboard, such signal producing minimal radio frequency noise.

It is another object of the present invention to provide an improved keyboard encoding circuit for producing a uniquely distinguishable DC output voltage upon individual operation of any key.

It is another object of the present invention to provide an improved keyboard encoding circuit wherein simultaneous operation of two or more keys produces output signals distinguishable from any signal produced by individual operation of any one key.

It is still another object of the present invention to provide an improved keyboard encoding circuit producing a DC signal output for remote conversion to a digitally encoded signal by an A/D converter for transmission to a digital data acquisition device.

It is further object of the present invention to provide an improved keyboard encoding circuit producing DC output signals in response to key operation having voltage levels evenly distributed throughout the output signal range.

The subject matter of the present invention is particularly pointed out and distinctly claimed in the concluding portion of this specification. However, both the organization and method of operation, together with further advantages and objects thereof, may best be understood by reference to the following description taken in conjunction with the accompanying drawing.

DESCRIPTION OF THE DRAWING

The single drawing FIGURE is a combination block and schematic diagram of a keyboard encoding system incorporating the present invention.

DETAILED DESCRIPTION

Referring to the single drawing FIGURE, illustrating a keyboard encoding system 10 according the the present invention in block and schematic form, such system comprises a switch matrix 12 coupling a vertical resistor set 14 to a horizontal resistor set 16, a power supply 18 for supplying DC source current to encoding system 10, and an analog-to-digital (A/D) converter 20 for converting analog output voltage signals from encoding system 10 into digital signals for transmission to digital data acquisition means 22.

Switch matrix 12 comprises normally open, manually operated key switches schematically arranged in an array comprising rows numbered 0 through 7 and columns numbered 0 through 7. In the preferred embodiment switch matrix 12 includes eight rows and eight columns. However the present invention may be practiced with nearly any number of rows and nearly any number of columns. Each switch in the matrix 12 is designated by switch reference character $S_{ij}$ where "i" is an integer denoting the row number and "j" is an integer denoting the column number of matrix 12 wherein each switch $S_{ij}$ is positioned.

Vertical resistor set 14 comprises eight resistors, one resistor being associated with each row of switch matrix 12 and each resistor being denoted by reference character $R_{ri}$ where "i" is an integer indicating the associated row number. One side of each resistor $R_{ri}$ is tied in common to lead 24 from power supply 18. A second side of each resistor $R_{ri}$ is tied to one side of each switch $S_{ij}$ in the associated row.

Horizontal resistor set 16 also comprises eight resistors, one resistor being associated with each column of switch matrix 12 and each resistor being denoted by reference character $R_{cj}$ where "j" is an integer indicating the associated column number. One side of each resistor $R_{cj}$ is tied in common to lead 26 coupled to A/D converter 20. A second side of each resistor $R_{cj}$ is tied to one side of each switch $S_{ij}$ in the associated column. Leads 24 and 26 are interconnected through shunting resistor $R_s$.

Power supply 18 introduces a constant DC supply current $I_d$ via lead 24. When all keys $S_{ij}$ are open, A/D converter 20 input signal voltage across resistor $R_s$ is at a maximum. On closing any single switch $S_{ij}$, the resistance $R_g$ viewed from lead 24 to lead 26 will equal the sum of the connected row and column resistors $R_{ri}$ and $R_{cj}$ in parallel with $R_s$. Thus $$R_g = [(R_{ri} + R_{cj})(R_s)]/(R_{ri} + R_{cj} + R_s)$$

when any one switch $S_{ij}$ is closed. If $R_s$ is much larger than $(R_{ri} + R_{cj})$, then $R_g$ is approximately equal to the sum of $R_{ri}$ and $R_{cj}$ or, $$R_g = R_{ri} + R_{cj}.$$

The voltage $V_s$ across resistor $R_s$ is equal to the product of the supply current $I_s$ and $R_g$ or, in equation form:

$$V_s = I_s R_g.$$

If $I_s$ is constant, then $V_s$ will be unique for each individual switch closure if the combination of the corresponding row and column resistors $R_{ri}$ and $R_{cj}$ is unique for each switch $S_{ij}$. Therefore, in the preferred embodiment of the present invention, the resistance values of all $R_{ri}$ and $R_{cj}$ are chosen such that $(R_{ri} + R_{cj})$ is unique for each combination of "i" and "j". Row resistors $R_{ri}$ are chosen such that no two row resistors have the same resistance and column resistors $R_{cj}$ are chosen such that no two column resistors have the same resistance. Further, row and column resistors are chosen such that not more than one row resistor has the same resistance as any column resistor.

When any two switches $S_{ij}$ are closed at the same time, the resistance $R_g$ is equal to the parallel combination of the $(R_{ri} + R_{cj})_1$ resistance associated with a first closed switch, the $(R_{ri} + R_{cj})_2$ resistance associated with a second closed. switch and $R_s$. Again assuming a large $R_s$ compared to the values of $R_{ri}$ and $R_{cj}$, $R_g$ is found as follows:

$$R_g = [(R_{ri}+R_{cj})_1 (R_{ri}+R_{cj})_2]/[(R_{ri}+R_{cj})_1 + (R_{ri}+R_{cj})_2],$$

where the subscripts 1 and 2 denote row and column resistance sums associated with the first and second switches. If three or more switches $S_{ij}$ are simultaneously closed, then $R_g$ will substantially equal the parallel combination of the three or more associated $(R_{ri}+R_{cj})$ sums.

It is possible that even though resistances $R_{ri}$ and $R_{cj}$ are chosen as described above such that the quantity $(R_{ri}+R_{cj})$ is unique for each combination of row and column, the closing of two or more keys could produce an $R_g$ of magnitude equal to or very close to the magnitude of an $R_g$ resulting from a single switch $S_{ij}$ closing. If such a resistance $R_g$ is produced by closing a plurality of switches, then a signal voltage $V_s$ could be produced which would appear to converter 20 to have been caused by the single switch $S_{ij}$ closing. The converter would then erroneously transmit a false digital code to data acquisition device 22 incorrectly indicating the single switch closing.

To eliminate the possibility of such error in the preferred embodiment of the present invention, the values of $R_{ri}$ and $R_{cj}$ are chosen such that no combination of multiple switch closures can provide an $R_g$ confusingly similar to an $R_g$ produced by a single switch closure. The preferred method of doing so is to choose the highest magnitude of any row resistor resistance to be on the order of twice (and preferably not more than twice) the lowest resistance magnitude of any row resistor $R_{ri}$, with all other row resistors having resistances of intermediate, differing values. At the same time, the smallest column resistor is selected to be larger than the smallest row resistor while the largest column resistor is selected to be equal to or smaller than the second smallest row resistor, with the remaining column resistors also having differing, intermediate magnitudes.

With row and column resistances so chosen, the resistance $R_g$ between leads 24 and 26 will always be smaller when more than one switch $S_{ij}$ is closed than when any one switch is uniquely closed because the parallel combinations of $(R_{ri}+R_{cj})$ sums associated with multiple switch closures will always be less than than $(R_{ri}+R_{cj})$ for any single row and column resistor combination. Therefore the signal voltage $V_s$ produced by any multiple switch closure will be less than the signal voltage produced by any single switch closure. A multiple switch closure would thus cause A/D converter 20 to generate a digital code different from any code produced by a single switch closure and data acquisition device 22 would then be able recognize and/or discard the invalid code so generated.

Keyboard encoding circuit 10 may be implemented in conjunction with an A/D converter 20 of minimal resolution if the signal voltage $V_s$ levels associated with the switch $S_{ij}$ closures are as evenly spaced as possible over the range of $V_s$. In the preferred embodiment, the magnitudes of the row resistors 14 are evenly spaced from largest to smallest, as are the magnitudes of the column resistors. Further, the largest column resistor is made equal in value to the second largest row resistor while the smallest column resistor is larger than the smallest row resistor by an amount equal to the spacing between column resistor magnitudes. Signal voltage $V_s$ applied to converter 20 will then vary in substantially even steps throughout its range.

Assuming row resistors are numbered consecutively in ascending order of magnitude from 0 to n and column resistors are numbered consecutively in ascending order of magnitude from 0 to m, and that $R_{cm}$ is selected to equal $R_{r1}$ (the second smallest row resistor), and assuming that $R_{c0}$ is to be larger than $R_{r0}$ by an amount equal to the magnitude spacing of the column resistors, then the following relations may be used to select resistance values for a particular embodiment of the present invention:

$$R_{ri} = R_{r0} + (i)(R_{rn} - R_{r0})/n$$

$$R_{cj} = R_{r0} + (j+1)(R_{r1} - R_{r0})/(m+1)$$

It should be noted that the present invention will meet the same criteria of non-ambiguity in signal voltage output and level spacing noted above if the magnitudes of the column resistances are similarly spaced in magnitude between the magnitudes of any two nearest row resistors. It should also be noted that the present invention in alternative embodiments may comprise a switch matrix 12 wherein not every switch $S_{ij}$ is present in the circuit.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A keyboard encoder circuit comprising:
   a first set of resistors, each of the resistors of the first set having first and second end leads, the resistance values of the resistors of said first set differing one from another,
   a first terminal coupled in common to first end leads of resistors of the first set,
   a second set of resistors, each of the resistors of the second set having first and second end leads, the resistance values of the resistors of said second set differing one from another,
   a second terminal coupled in common to second end leads of the resistors of the second set, and
   a plurality of switch banks with one switch bank corresponding to each resistor of the first set, each switch bank having a switch corresponding to each resistor of the second set, each switch in each switch bank having input and output connections,
   the second end lead of each resistor of the first set being coupled to the input connection of each switch of the corresponding switch bank, and the first end lead of each resistor of the second set being coupled to the output connection of a corresponding switch in each of the switch banks,
   the resistors of the first and second sets being selected such that every possible combination of one resistor selected from the first set and one resistor selected from the second set produces a unique sum when the resistance magnitudes of the selected resistors are added.

2. A keyboard encoder circuit as in claim 1 wherein each switch of each switch bank is a manually actuable keyboard switch.

3. A keyboard encoder circuit as in claim 1 further comprising a source of voltage coupled to one of said terminals and means to convert the output voltage signal on the other of said terminals to a digitally encoded signal corresponding to each output voltage signal magnitude.

4. A keyboard encoder circuit as in claim 1 wherein not more than one resistor of the first set has the same magnitude as any resistor of the second set.

5. A keyboard encoder circuit as in claim 4 wherein the resistance magnitudes of the resistors of the first and second sets are equally spaced from largest to smallest within each set.

6. A keyboard encoder circuit as in claim 4 wherein the resistance magnitudes of the resistors of the first and second sets are selected such that simultaneous actuation of any two or more switches will not produce a resistance magnitude between said terminals equal to that produced by the actuation of any one switch.

7. A keyboard encoder circuit as in claim 6 wherein the resistance magnitude of the largest resistor of the first set is not more than twice the magnitude of the smallest resistor of the first set, wherein the resistance magnitude of the largest resistor of the second set is not larger than the magnitude of the largest resistor of the first set, and wherein the resistance magnitude of the smallest resistor of the second set is not smaller than the magnitude of the smallest resistor of the first set.

8. A keyboard encoder circuit as in claim 7 wherein the resistance magnitude of the largest resistor of the second set is equal to the resistance magnitude of the second smallest resistor of the first set and wherein the resistance magnitude of the smallest resistor of the second set is larger than the resistance of the smallest resistor of the first set by an amount equal to the magnitude spacing of resistors of the second set.

9. A keyboard encoder circuit as in claim 7 wherein the resistance magnitudes of the resistors of the second set are bounded by the resistance magnitudes of any two nearest first set resistance magnitudes.

10. A keyboard encoding circuit comprising:
    a first set of resistors each having first and second end terminals,
    a source of direct current coupled to the first terminal of each resistor of the first set,
    a second set of resistors having first and second end terminals,
    a plurality of switch banks of manually actuable keyboard switches, one switch bank corresponding to each resistor of the first set, each switch bank having not more than one switch corresponding to each resistor of the second set, each switch in each switch bank having input and output connections,
    the second terminal of each resistor of the first set being coupled to the input connection of each switch of the corresponding switch bank, the first terminal of each resistor of the second set being coupled to the output connection of each corresponding switch of the switch banks, the first terminals of each resistor of the first set being coupled in common and the second terminals of each resistor of the second set being coupled in common to provide a direct current output voltage signal between the first terminals of the first resistor set and the second terminals of the second resistor set upon actuation of any switch of any switch bank, and means to convert the output voltage signal to a digitally encoded signal corresponding to each unique output voltage signal magnitude, the resistance magnitudes of the resistors of the first and second sets being selected such that the output voltage signal produced by sole actuation of any one switch is of a magnitude not produced by sole actuation of any other switch.

11. A keyboard encoding circuit according to claim 10 wherein the resistance magnitudes of resistors of the first set are all different and evenly spaced from largest to smallest, the largest being not more than twice the smallest, and wherein the resistance magnitudes of resistors of the second set are all different and evenly spaced from largest to smallest, the largest resistor of the second set having a resistance magnitude not more than that of the second smallest resistor of the first set, and the smallest resistor of the second set having a resistance magnitude not less than that of the smallest resistor of the first set.

12. A keyboard encoding circuit according to claim 10 wherein the resistance magnitudes of resistors of the second set are all different and evenly spaced from largest to smallest, the largest being not more than twice the smallest, and wherein the resistance magnitudes of resistors of the first set are all different and evenly spaced from largest to smallest, the largest resistor of the first set having a resistance magnitude not more than that of the second smallest resistor of the second set, and the smallest resistor of the first set having a resistance magnitude not less than that of the smallest resistor of the second set.

13. A keyboard encoding circuit as in claim 10, assuming said resistors of the first set are numbered from 0 to n consecutively from smallest to largest, the ith resistor of said first set of resistors being of magnitude represented by the variable $R_i$, that said resistors of the second set are numbered from 0 to m consecutively from smallest to largest, the jth resistor of said second set of resistors being of magnitude represented by the variable $R_{cj}$, wherein the resistors of the first set are sized according to the relation, $R_{ri} = R_{r0} + (i)(R_{rn} - R_{r0})/n$, while the resistors of the second set are sized according to the relation, $R_{cj} = R_{r0} = (j+1)(R_{ri} - R_{r0})/(m+1)$.

* * * * *